United States Patent
Torardi et al.

(10) Patent No.: US 9,793,025 B2
(45) Date of Patent: Oct. 17, 2017

(54) CONDUCTIVE PASTE COMPOSITION AND SEMICONDUCTOR DEVICES MADE THEREWITH

(71) Applicant: E I DU PONT DE NEMOURS AND COMPANY, Wilmington, DE (US)

(72) Inventors: Carmine Torardi, Wilmington, DE (US); Paul Douglas Vernooy, Hockessin, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 271 days.

(21) Appl. No.: 14/552,660

(22) Filed: Nov. 25, 2014

(65) Prior Publication Data

US 2015/0155069 A1    Jun. 4, 2015

Related U.S. Application Data

(60) Provisional application No. 61/911,034, filed on Dec. 3, 2013.

(51) Int. Cl.
| | |
|---|---|
| H01B 1/22 | (2006.01) |
| H01L 31/18 | (2006.01) |
| H01L 31/0224 | (2006.01) |
| H01B 1/16 | (2006.01) |

(52) U.S. Cl.
CPC .............. H01B 1/22 (2013.01); H01B 1/16 (2013.01); H01L 31/022425 (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 7,736,546 B2 | 6/2010 | Prunchak | |
| 7,935,279 B2 | 5/2011 | Prunchak | |
| 8,383,011 B2 | 2/2013 | Castillo et al. | |
| 2006/0289055 A1 | 12/2006 | Sridharan et al. | |
| 2009/0101872 A1* | 4/2009 | Young | C03C 8/14 252/514 |
| 2009/0189126 A1 | 7/2009 | Prunchak | |
| 2011/0094578 A1* | 4/2011 | Akimoto | H01L 31/022425 136/256 |
| 2011/0146776 A1* | 6/2011 | Carroll | C03C 8/06 136/256 |
| 2011/0192457 A1 | 8/2011 | Nakayama et al. | |
| 2011/0232746 A1 | 9/2011 | Carroll et al. | |
| 2012/0305858 A1 | 12/2012 | Hang et al. | |
| 2013/0043441 A1 | 2/2013 | Ozawa et al. | |
| 2013/0049148 A1 | 2/2013 | Hang et al. | |

(Continued)

OTHER PUBLICATIONS

PCT International Search Report and Written Opinion for International application No. PCT/US14/68088, dated Feb. 24, 2015.

*Primary Examiner* — Katie L Hammer

(57) ABSTRACT

A conductive paste composition contains a source of an electrically conductive metal, a boron lithium tellurium oxide, and an organic vehicle. An article such as a high-efficiency photovoltaic cell is formed by a process of deposition of the paste composition on a semiconductor device substrate (e.g., by screen printing) and firing the paste to remove the organic vehicle and sinter the metal and establish electrical contact between it and the substrate.

20 Claims, 1 Drawing Sheet

(56) References Cited

U.S. PATENT DOCUMENTS

| | | |
|---|---|---|
| 2013/0068290 A1 | 3/2013 | Hang et al. |
| 2013/0161573 A1 | 6/2013 | Torardi et al. |
| 2013/0255770 A1 | 10/2013 | Carroll et al. |
| 2013/0270489 A1 | 10/2013 | Wang et al. |
| 2013/0284256 A1 | 10/2013 | Laughlin et al. |
| 2013/0298982 A1* | 11/2013 | Hang .............. H01L 31/022425 136/256 |

* cited by examiner

CONDUCTIVE PASTE COMPOSITION AND SEMICONDUCTOR DEVICES MADE THEREWITH

CROSS-REFERENCE TO RELATED APPLICATION

This application claims benefit of U.S. Provisional Patent Application Ser. No. 61/911,034, filed Dec. 3, 2013 and entitled "Conductive Paste Composition and Semiconductor Devices Made Therewith," which is incorporated herein in its entirety by reference thereto.

FIELD OF THE INVENTION

The present invention relates to a conductive paste composition that is useful in the construction of a variety of electrical and electronic devices, and more particularly to a paste composition useful in creating conductive structures, including front-side electrodes for photovoltaic devices.

TECHNICAL BACKGROUND OF THE INVENTION

A conventional photovoltaic cell incorporates a semiconductor structure with a junction, such as a p-n junction formed with an n-type semiconductor and a p-type semiconductor. More specifically, Si solar cells are typically made by adding controlled impurities (called dopants) to purified Si. Different dopants result in either p-type or n-type material, in which there are respectively positive or negative majority charge carriers. The cell structure includes a boundary or junction between p-type and n-type Si. When the cell is illuminated by radiation of an appropriate wavelength, such as sunlight, a potential (voltage) difference across the junction creates free charge carriers. These electron-hole pair charge carriers migrate in the electric field generated by the p-n junction and are collected by electrodes on respective surfaces of the semiconductor. The cell is thus adapted to supply electric current to an electrical load connected to the electrodes, thereby providing electrical energy converted from the incoming solar energy that can do useful work. For the typical p-base configuration, a negative electrode is located on the side of the cell that is to be exposed to a light source (the "front" side, which in the case of a solar cell is the side exposed to sunlight), and a positive electrode is located on the other side of the cell (the "back" side). Solar-powered photovoltaic systems are considered to be environmentally beneficial in that they reduce the need for fossil fuels used in conventional electric power plants.

Industrial photovoltaic cells are commonly provided in the form of a structure, such as one based on a doped crystalline silicon wafer, that has been metalized, i.e., provided with electrodes in the form of electrically conductive metal contacts through which the generated current can flow to an external electrical circuit load. Most commonly, these electrodes are provided on opposite sides of a generally planar cell structure. Conventionally, they are produced by applying suitable conductive metal pastes to the respective surfaces of the semiconductor body and thereafter firing the pastes.

Photovoltaic cells are commonly fabricated with an insulating layer on their front side to afford an anti-reflective property that maximizes the utilization of incident light. However, in this configuration, the insulating layer normally must be removed to allow an overlaid front-side electrode to make contact with the underlying semiconductor surface.

The front-side conductive metal paste typically includes a glass frit and a conductive species (e.g., silver particles) carried in an organic medium that functions as a vehicle for printing. The electrode may be formed by depositing the paste composition in a suitable pattern (for instance, by screen printing) and thereafter firing the paste composition and substrate to dissolve or otherwise penetrate the insulating anti-reflective layer and sinter the metal powder, such that an electrical connection with the semiconductor structure is formed.

The ability of the paste composition to penetrate or etch through the anti-reflective layer and form a strong adhesive bond with the substrate upon firing is highly dependent on the composition of the conductive paste and the firing conditions. Key measures of photovoltaic cell electrical performance, such as efficiency, are also influenced by the quality of the electrical contact made between the fired conductive paste and the substrate.

Although various methods and compositions useful in forming devices such as photovoltaic cells are known, there nevertheless remains a need for compositions that permit fabrication of patterned conductive structures that provide improved overall device electrical performance and that facilitate the efficient manufacture of such devices.

One common class of Si solar cell designs employs a 200 μm thick p-type Si wafer with a 0.4 μm layer of n-type Si on the wafer's front surface. The p-type wafer provides the base and the n-type layer is the emitter. In various implementations the n-type layer is made by either diffusing or ion implanting phosphorus (P) dopant into the Si wafer.

Dopant concentration must be controlled to achieve optimal cell performance. A high dopant concentration in the emitter imparts low electrical emitter sheet resistivity and enables a low resistivity metal contact to be made at the Si surface, thereby decreasing resistance losses. However, a high dopant concentration also introduces crystalline defects or electrical perturbations in the Si lattice that increase recombination losses that reduce both the current and voltage of the cell.

As known to one skilled in the art (see, e.g., S. W. Jones, "Diffusion in Silicon," IC Knowledge LLC (2008), pp. 56-62), total dopant concentration is typically measured using a SIMS (secondary ion mass spectrometry) depth profiling method and active dopant concentration is measured using SRP (spreading resistance probing) or ECV (electrochemical capacitance voltage) methods.

The wafers most commonly used in conventional photovoltaic cells are prepared with emitters that have a total concentration of P dopant at the surface $[P_{surface}]$ ranging from 9 to $15 \times 10^{20}$ atoms/cm$^3$. The active $[P_{surface}]$ typically ranges from 3 to $4 \times 10^{20}$ atoms/cm$^3$. Such emitters are termed as highly or heavily doped emitters (HDE), and the wafers incorporating those emitters are often referenced simply as "HDE wafers."

A concentration of P dopant at the front surface ($[P_{surface}]$) above $\sim 1 \times 10^{20}$ atoms/cm$^3$ in Si leads to various types of recombination. Recombined charge carriers are bound to the Si lattice and unable to be collected as electrical energy. The solar cell energy loss results from a decrease of both Voc (open circuit voltage) and Isc (short circuit current). P dopant in excess of the active concentration (inactive P) leads to Shockley-Read-Hall (SRH) recombination energy loss. Active P dopant above $\sim 1 \times 10^{20}$ atoms/cm$^3$ leads to Auger recombination energy loss.

Emitters made with low dopant concentration at the wafer surface are called lightly or low-doped emitters (LDE). A wafer having $[P_{surface}] < 1 \times 10^{20}$ atoms/cm$^3$ is typically termed an LDE wafer. Solar cell embodiments employing lightly doped emitters in some instances achieve improved solar cell performance by decreasing the losses resulting from electron-hole recombination at the front surface. However, the inherent potential of LDE-based cells to provide improved cell performance is frequently mitigated in practice by the greater difficulty of forming the high-quality metal contacts needed to efficiently extract current from the operating cell.

As a result, wafers used for commercial solar cells typically employ high [$P_{surface}$] emitters, as discussed above, which degrade short wavelength response (short wavelengths have a very high absorption coefficient in silicon and are absorbed very close to the surface) and result in lower open-circuit voltage (Voc) and short-circuit current density (Jsc). The high [$P_{surface}$] emitters enable formation of low contact resistivity metallization contacts, without which contact is poor and cell performance is degraded.

Nevertheless, an improvement in cell performance is potentially attainable with LDE-based cells. Such cells would require a thick-film metallization paste that can reliably contact lightly doped, low [$P_{surface}$] emitters without damaging the emitter layer surface, while still providing low contact resistance. Ideally, such a paste would enable screen-printed crystalline silicon solar cells to have reduced saturation current density at the front surface (J0e) and accompanying increased Voc and Jsc, and therefore improved solar cell performance. Other desirable characteristics of a paste would include high bulk conductivity and the ability to form narrow, high-aspect-ratio contact lines in a metallization pattern to further reduce series resistance and minimize shading of incident light by the electrodes, as well as good adherence to the substrate.

SUMMARY OF THE INVENTION

An embodiment of the invention relates to a paste composition comprising:
  (a) a source of electrically conductive metal;
  (b) a boron lithium tellurium oxide; and
  (c) an organic vehicle in which the source of electrically conductive metal and the boron lithium tellurium oxide are dispersed.

Embodiments of the present disclosure include ones in which the boron lithium tellurium oxide comprises 15 to 40 cation % B, 10 to 45 cation % Li, and 20 to 65 cation % Te, and ones in which the boron, lithium, and tellurium cations together comprise 80 to 100 cation % of the boron lithium tellurium oxide.

In certain embodiments, the paste composition further comprises 0.01 to 5 wt. %, or 0.05 to 2.5 wt. %, or 0.1 to 1 wt. % of a discrete oxide additive, or a metal or compound that generates an oxide upon firing.

Another aspect provides a process for forming an electrically conductive structure on a substrate, the process comprising:
  (a) providing a substrate having a first major surface and an insulating layer thereon that comprises aluminum oxide, titanium oxide, silicon nitride, $SiN_x$:H, silicon oxide, or silicon oxide/titanium oxide;
  (b) applying a paste composition onto a preselected portion of the insulating layer on the first major surface, wherein the paste composition comprises:
    i) a source of electrically conductive metal,
    ii) a boron lithium tellurium oxide, and
    iii) an organic vehicle in which the source of electrically conductive metal and the boron lithium tellurium oxide are dispersed; and
  (c) firing the substrate and paste composition thereon, wherein the insulating layer is penetrated and the electrically conductive metal is sintered during the firing to form the electrically conductive structure and provide electrical contact between the electrically conductive metal and the substrate.

In a further implementation, the substrate includes an anti-reflective layer on its surface, and the firing results in the paste at least partially etching through the anti-reflective layer, such that electrical contact between the conductive structure and the substrate is established.

Further, there is provided an article comprising a substrate and an electrically conductive structure thereon, the article having been formed by the foregoing process. Representative articles of this type include a semiconductor device and a photovoltaic cell. In an embodiment, the substrate comprises a silicon wafer.

BRIEF DESCRIPTION OF THE DRAWINGS

The invention will be more fully understood and further advantages will become apparent when reference is made to the following detailed description of the preferred embodiments of the invention and the accompanying drawings, wherein like reference numerals denote similar elements throughout the several views and in which.

Figure 1A:
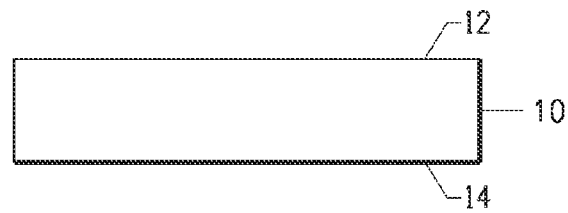
FIGS. 1A-1F illustrate successive steps of a process by which a semiconductor device may be fabricated. The device in turn may be incorporated into a photovoltaic cell.

Reference numerals as used in FIGS. 1A-1F include the following:
  10: p-type substrate
  12: first major surface (front side) of substrate 10
  14: second major surface (back side) of substrate 10
  20: n-type diffusion layer
  30: insulating layer
  40: p+ layer
  60: aluminum paste formed on back side
  61: aluminum back electrode (obtained by firing back-side aluminum paste)
  70: silver or silver/aluminum paste formed on back side
  71: silver or silver/aluminum back electrode (obtained by firing back-side paste)
  500: conductive paste formed on front side according to the invention
  501: conductive front electrode according to the invention (formed by firing front-side conductive paste)

DETAILED DESCRIPTION OF THE INVENTION

The present invention addresses the need for a process to manufacture high performance semiconductor devices having mechanically robust, high conductivity electrodes. The conductive paste composition provided herein is beneficially employed in the fabrication of front-side electrodes of photovoltaic devices. Ideally, a paste composition promotes the formation of a front-side metallization that: (a) adheres strongly to the underlying semiconductor substrate; and (b) provides a relatively low resistance contact with the substrate. Suitable paste compositions are believed to aid in etching surface insulating layers often employed in semiconductor structures such as photovoltaic cells to allow contact between the conductive electrode and the underlying semiconductor.

In an aspect, this invention provides a paste composition that comprises: a functional conductive component, such as a source of electrically conductive metal; a boron lithium tellurium oxide; an optional discrete inorganic additive; and an organic vehicle. Certain embodiments involve a photovoltaic cell that includes a conductive structure made with the present paste composition. Such cells may provide any combination of one or more of high photovoltaic conversion efficiency, high fill factor, and low series resistance.

In various embodiments, the present paste composition may comprise an inorganic solids portion comprising (a) about 75% to about 99.5% by weight, or about 90% to about 99% by weight, or about 95% to about 99% by weight, of a source of an electrically conductive metal; (b) about 1% to about 15% by weight, or about 1% to about 8% by weight, or about 2% to about 6% by weight, or about 1% to about 5% by weight, or about 1% to about 3% by weight, of a boron lithium tellurium oxide material, wherein the above stated contents of constituents (a) and (b) are based on the total weight of all the constituents of the inorganic solids portion of the composition, apart from the organic medium.

As further described below, the paste composition further comprises an organic vehicle, which acts as a carrier for the inorganic constituents, which are dispersed therein. The paste composition may include still additional components such as surfactants, thickeners, thixotropes, and binders.

Typically, electrodes and other conductive traces are provided by screen printing the paste composition onto a substrate, although other forms of printing, such as plating, extrusion, inkjet, shaped or multiple printing, or ribbons may also be used. After deposition, the composition, which typically comprises a conductive metal powder (e.g., Ag), a frit, and optional inorganic additives in an organic carrier, is fired at an elevated temperature.

The composition also can be used to form conductive traces, such as those employed in a semiconductor module that is to be incorporated into an electrical or electronic device. As would be recognized by a skilled artisan, the paste composition described herein can be termed "conductive," meaning that the composition can be formed into a structure and thereafter processed to exhibit an electrical conductivity sufficient for conducting electrical current between devices or circuitry connected thereto.

I. Inorganic Components

An embodiment of the present invention relates to a paste composition, which may include: an inorganic solids portion comprising a functional material providing electrical conductivity, a boron lithium tellurium oxide fusible material; and an organic vehicle in which the inorganic solids are dispersed. The paste composition may further include additional components such as surfactants, thickeners, thixotropes, and binders.

A. Electrically Conductive Metal

The present paste composition includes a source of an electrically conductive metal. Exemplary metals include without limitation silver, gold, copper, nickel, palladium, platinum, aluminum, and alloys and mixtures thereof. Silver is preferred for its processability and high conductivity. However, a composition including at least some non-precious metal may be used to reduce cost.

The conductive metal may be incorporated directly in the present paste composition as a metal powder. In another embodiment, a mixture of two or more such metals is directly incorporated. Alternatively, the metal is supplied by a metal oxide or salt that decomposes upon exposure to the heat of firing to form the metal. As used herein, the term "silver" is to be understood as referring to elemental silver metal, alloys of silver, and mixtures thereof, and may further include silver derived from silver oxide ($Ag_2O$ or $AgO$) or silver salts such as $AgCl$, $AgNO_3$, $AgOOCCH_3$ (silver acetate), $AgOOCF_3$ (silver trifluoroacetate), $Ag_3PO_4$ (silver orthophosphate), or mixtures thereof. Any other form of conductive metal compatible with the other components of the paste composition also may be used.

Electrically conductive metal powder used in the present paste composition may be supplied as finely divided particles having any one or more of the following morphologies: a powder form, a flake form, a spherical form, a rod form, a granular form, a nodular form, a crystalline form, other irregular forms, or mixtures thereof. The electrically conductive metal or source thereof may also be provided in a colloidal suspension, in which case the colloidal carrier would not be included in any calculation of weight percentages of the solids of which the colloidal material is part.

The particle size of the metal is not subject to any particular limitation. As used herein, "particle size" is intended to refer to "median particle size" or $d_{50}$, by which is meant the 50% volume distribution size. The distribution may also be characterized by $d_{90}$, meaning that 90% by volume of the particles are smaller than $d_{90}$. Volume distribution size may be determined by a number of methods understood by one of skill in the art, including but not limited to laser diffraction and dispersion methods employed by a Microtrac particle size analyzer (Montgomeryville, Pa.). Laser light scattering, e.g., using a model LA-910 particle size analyzer available commercially from Horiba Instruments Inc. (Irvine, Calif.), may also be used. In various embodiments, the median particle size is greater than 0.2 μm and less than 10 μm, or the median particle size is greater than 0.4 μm and less than 5 μm, as measured using the Horiba LA-910 analyzer.

The electrically conductive metal may comprise any of a variety of percentages of the composition of the paste composition. To attain high conductivity in a finished conductive structure, it is generally preferable to have the concentration of the electrically conductive metal be as high as possible while maintaining other required characteristics of the paste composition that relate to either processing or final use. In an embodiment, the silver or other electrically conductive metal may comprise about 75% to about 99% by weight, or about 85% to about 99% by weight, or about 95% to about 99% by weight, of the inorganic solid components of the paste composition. In another embodiment, the solids portion of the paste composition may include about 80 wt. % to about 90 wt. % silver particles and about 1 wt. % to about 9 wt. % silver flakes. In an embodiment, the solids portion of the paste composition may include about 70 wt. % to about 90 wt. % silver particles and about 1 wt. % to about 9 wt. % silver flakes. In another embodiment, the solids portion of the paste composition may include about 70 wt. % to about 90 wt. % silver flakes and about 1 wt. % to about 9 wt. % of colloidal silver. In a further embodiment, the solids portion of the paste composition may include about 60 wt. % to about 90 wt. % of silver particles or silver flakes and about 0.1 wt. % to about 20 wt. % of colloidal silver.

The electrically conductive metal used herein, particularly when in powder form, may be coated or uncoated; for example, it may be at least partially coated with a surfactant to facilitate processing. Suitable coating surfactants include, for example, stearic acid, palmitic acid, a salt of stearate, a salt of palmitate, and mixtures thereof. Other surfactants that also may be utilized include lauric acid, oleic acid, capric acid, myristic acid, linoleic acid, and mixtures thereof. Still other surfactants that also may be utilized include polyethylene oxide, polyethylene glycol, benzotriazole, poly(ethylene glycol)acetic acid, and other similar organic molecules. Suitable counter-ions for use in a coating surfactant include without limitation hydrogen, ammonium, sodium, potassium, and mixtures thereof. When the electrically conductive metal is silver, it may be coated, for example, with a phosphorus-containing compound.

In an embodiment, one or more surfactants may be included in the organic vehicle in addition to any surfactant included as a coating of conductive metal powder used in the present paste composition.

As further described below, the electrically conductive metal can be dispersed in an organic vehicle that acts as a carrier for the metal phase and other constituents present in the formulation.

B. Boron Lithium Tellurium Oxide

The present paste composition includes a fusible boron lithium tellurium oxide. The term "fusible," as used herein, refers to the ability of a material to become fluid upon heating, such as the heating employed in a firing operation. In some embodiments, the fusible material is composed of one or more fusible subcomponents. For example, the fusible material may comprise a glass material, or a mixture of two or more glass materials. Glass material in the form of a fine powder, e.g., as the result of a comminution operation, is often termed "frit" and is readily incorporated in the present paste composition.

As used herein, the term "glass" refers to a particulate solid form, such as an oxide or oxyfluoride, that is at least predominantly amorphous, meaning that short-range atomic order is preserved in the immediate vicinity of any selected atom, that is, in the first coordination shell, but dissipates at greater atomic-level distances (i.e., there is no long-range periodic order). Hence, the X-ray diffraction pattern of a fully amorphous material exhibits broad, diffuse peaks, and not the well-defined, narrow peaks of a crystalline material. In the latter, the regular spacing of characteristic crystallographic planes give rise to the narrow peaks, whose position in reciprocal space is in accordance with Bragg's law. A glass material also does not show a substantial crystallization exotherm upon heating close to or above its glass transition temperature or softening point, $T_g$, which is defined as the second transition point seen in a differential thermal analysis (DTA) scan. In an embodiment, the softening point of glass material used in the present paste composition is in the range of 300 to 800° C.

It is also contemplated that some or all of the boron lithium tellurium oxide material may be composed of material that exhibits some degree of crystallinity. For example, in some embodiments, a plurality of oxides are melted together, resulting in a material that is partially amorphous and partially crystalline. As would be recognized by a skilled person, such a material would produce an X-ray diffraction pattern having narrow, crystalline peaks superimposed on a pattern with broad, diffuse peaks. Alternatively, one or more constituents, or even substantially all of the fusible material, may be predominantly or even substantially fully crystalline. In an embodiment, crystalline material useful in the fusible material of the present paste composition may have a melting point of at most 800° C.

The fusible material used in the present paste composition is a boron lithium tellurium oxide. As used herein, the term "boron lithium tellurium oxide" refers to an oxide material containing boron, lithium, and tellurium cations that together comprise at least 80% of the cations present in the material, and wherein the minimum content of boron, lithium, and tellurium cations is at least 15, 10, and 20 cation %, respectively. In various embodiments, the combination of boron, lithium, and tellurium cations represents at least 80%, 90%, 95%, or up to 100% of the cations in the boron lithium tellurium oxide.

The boron lithium tellurium oxide used in the present paste composition is described herein as including percentages of certain components. Specifically, the composition may be specified by denominating individual components that may be combined in the specified percentages to form a starting material that subsequently is processed, e.g., as described herein, to form a glass or other fusible material. Such nomenclature is conventional to one of skill in the art. In other words, the composition contains certain components, and the percentages of those components may be expressed as weight percentages of the corresponding oxide or other forms.

Alternatively, some of the compositions herein are set forth by cation percentages, which are based on the total cations contained in the boron lithium tellurium oxide. Of course, compositions thus specified include the oxygen or other anions associated with the various cations. A skilled person would recognize that compositions could equivalently be specified by weight percentages of the constituents, and would be able to perform the required numerical conversions.

The boron lithium tellurium oxide included in the present paste composition optionally incorporates other oxides, including oxides of one or more of the elements Al, Na, K, Rb, Cs, Ti, V, Cr, Mn, Fe, Co, Ni, Cu, Zn, Zr, Nb, Si, Mo, Hf, W, Ag, Ga, Ge, In, Sn, Sb, Se, Ru, Bi, P, Y, La and the other lanthanide elements, and mixtures thereof. (The term "lanthanide elements" is understood to include the elements of the periodic table having atomic numbers of 57 through 71, i.e., La—Lu.) This list is meant to be illustrative, not limiting. In various embodiments, the boron lithium tellurium oxide used in present paste composition may incorporate an oxide of the foregoing cations, or any mixture thereof, at up to a total of 5 cation %, or 10 cation %, or 15 cation %, or 20 cation %. Silver oxide may be included at up to 10 cation %, or 15 cation %, or 20 cation %. Such substances are intimately mixed at an atomic level in the boron lithium tellurium oxide, e.g., by melting the substances together. In different embodiments, the amount of these other oxides incorporated is such that the total cation percentage of them in the boron lithium tellurium oxide is up to 20%.

Although oxygen is typically the predominant anion in the boron lithium tellurium oxide of the present paste composition, some portion of the oxygen may be replaced by fluorine or other halide anions to alter certain properties, such as chemical, thermal, or rheological properties of the oxide that affect firing. In an embodiment, up to 10% of the oxygen anions of the boron lithium tellurium oxide in any of the formulations of the present paste composition are replaced by one or more halogen anions, including fluorine. For example, up to 10% of the oxygen anions may be replaced by fluorine. Halide anions may be supplied from halides of any of the composition's cations, including, but not limited to, NaCl, KBr, NaI, LiF, $CaF_2$, $MgF_2$, $BaCl_2$, and $BiF_3$.

For example, one of ordinary skill would recognize that embodiments wherein the boron lithium tellurium oxide contains fluorine can be prepared using fluorine anions supplied from a simple fluoride or an oxyfluoride. In an embodiment, the desired fluorine content can be supplied by replacing some or all of an oxide nominally incorporated in the composition with the corresponding fluoride of the same cation, such as by replacing some or all of the $Li_2O$ nominally included with the amount of LiF needed to attain the desired level of F content. Of course, the requisite amount of F can be derived by replacing the oxides of more than one cation of the boron lithium tellurium oxide if desired. Other fluoride sources could also be used, including sources such as ammonium fluoride that would decompose during the heating in typical glass preparation to leave behind residual fluoride anions. Useful fluorides include, but are not limited to, $CaF_2$, $BiF_3$, $AlF_3$, NaF, LiF, $ZrF_4$, $TiF_4$, and $ZnF_2$.

The present paste composition may further comprise an optional discrete oxide additive. It is contemplated that the additive may comprise an oxide of one element, two or more discrete oxides of various elements, or a discrete mixed oxide of multiple elements. As used herein, the term "oxide of an element" includes both the oxide compound itself and any other organic or inorganic compound of the element, or the pure element itself if it oxidizes or decomposes on heating to form the pertinent oxide. Such compounds known to decompose upon heating include, but are not limited to, carbonates, nitrates, nitrites, hydroxides, acetates, formates, citrates, and soaps of the foregoing elements, and mixtures thereof. For example, Zn metal, zinc acetate, zinc carbonate, and zinc methoxide are potential additives that would oxidize or decompose to form zinc oxide upon firing. The oxide is discrete, in that it is not mixed at an atomic level with the base boron lithium tellurium oxide frit, but is separately present in the paste composition. In an embodiment, the discrete oxide additive may be present in the paste composition in an amount ranging from 0.01 to 5 wt. %, or 0.05 to 2.5 wt. %, or 0.1 to 1 wt. %, based on the total weight of the paste composition.

Although in some embodiments the present composition (including the fusible material contained therein) may contain a small amount of lead, lead oxide, or other lead compound, e.g., in an amount up to 5 cation % in the boron lithium tellurium oxide, other embodiments are lead-free. As used herein, the term "lead-free paste composition" refers to a paste composition to which no lead has been specifically added (either as elemental lead or as a lead-containing alloy, compound, or other like substance), and in which the amount of lead present as a trace component or impurity is 1000 parts per million (ppm) or less. In some embodiments, the amount of lead present as a trace component or impurity is less than 500 ppm, or less than 300 ppm, or less than 100 ppm. Surprisingly and unexpectedly, photovoltaic cells exhibiting desirable electrical properties, such as high conversion efficiency, are obtained in some embodiments of the present disclosure, notwithstanding previous belief in the art that substantial amounts of lead must be included in a paste composition to attain these levels.

Similarly, embodiments of the present paste composition comprise cadmium, e.g., in an amount up to 5 cation % in the boron lithium tellurium oxide, while others are cadmium-free, again meaning that no Cd metal or compound is specifically added and that the amount present as a trace impurity is less than 1000 ppm, 500 ppm, 300 ppm, or 100 ppm.

In other embodiments, the boron lithium tellurium oxide of the present paste composition comprises, or consists essentially of:

15 to 40, or 20 to 40, or 25 to 35 cation % of B;

10 to 45, or 10 to 35, or 10 to 17.5, or 15 to 35 cation % of Li; and 20 to 65, or 25 to 55, or 20 to 29.5, or 20 to 24.5, or 35 to 55 cation % of Te, plus incidental impurities.

In still other embodiments, the boron lithium tellurium oxide of the present paste composition comprises, or consists essentially of:

15 to 40, or 20 to 40, or 25 to 35 cation % of B;

10 to 45, or 10 to 35, or 10 to 17.5, or 15 to 35 cation % of Li;

20 to 65, or 25 to 55, or 20 to 29.5, or 20 to 24.5, or 35 to 55 cation % of Te; and one or both of 0 to 2, 0 to 1.5, or 0.5 to 1.5 cation % of Ti; and 0 to 4.5 cation % of one or more of the alkaline earth metals Mg, Ca, Sr, and Ba, plus incidental impurities.

For example, the boron lithium tellurium oxide of the present paste composition may comprise, or consist essentially of:

15 to 40, or 20 to 40, or 25 to 35 cation % of B;

10 to 45, or 10 to 35, or 10 to 17.5, or 15 to 35 cation % of Li;

20 to 29.5 cation % of Te; and 0 to 4.5 cation % of one or more of the alkaline earth metals Mg, Ca, Sr, and Ba, plus incidental impurities.

One of ordinary skill in the art of glass chemistry would further recognize that any of the foregoing boron lithium tellurium oxide material compositions, whether specified by weight percentages or cation percentages of its constituent oxides, may alternatively be prepared by supplying the required anions and cations in requisite amounts from different components that, when mixed and fired, yield the same overall composition. For example, in various embodiments, phosphorus could be supplied either from $P_2O_5$, or alternatively from a suitable organic or inorganic phosphate that decomposes on heating to yield $P_2O_5$, or from a metal phosphate in which the metal is also a desired component of the final material. The skilled person would also recognize that a certain portion of volatile species, e.g., carbon dioxide, may be released during the process of making a fusible material.

It is known to those skilled in the art that a boron lithium tellurium oxide such as one prepared by a melting technique as described herein may be characterized by known analytical methods that include, but are not limited to: Inductively Coupled Plasma-Emission Spectroscopy (ICP-ES), Inductively Coupled Plasma-Atomic Emission Spectroscopy (ICP-AES), and the like. In addition, the following exemplary techniques may be used: X-Ray Fluorescence spectroscopy (XRF), Nuclear Magnetic Resonance spectroscopy (NMR), Electron Paramagnetic Resonance spectroscopy (EPR), Mössbauer spectroscopy, electron microprobe Energy Dispersive Spectroscopy (EDS), electron microprobe Wavelength Dispersive Spectroscopy (WDS), and Cathodoluminescence (CL). A skilled person could calculate percentages of starting components that could be processed to yield a particular fusible material, based on results obtained with such analytical methods.

The embodiments of the boron lithium tellurium oxide material described herein, including the compositions listed in Tables I and IV are not limiting; it is contemplated that one of ordinary skill in the art of glass chemistry could make minor substitutions of additional ingredients and not substantially change the desired properties of the boron lithium tellurium oxide composition, including its interaction with a substrate and any insulating layer thereon.

A median particle size of the boron lithium tellurium oxide material in the present composition may be in the range of about 0.5 to 10 μm, or about 0.8 to 5 μm, or about 1 to 3 μm, as measured using the Horiba LA-910 analyzer.

In an embodiment, the boron lithium tellurium oxide may be produced by conventional glass-making techniques and equipment. For the examples provided herein, the ingredients were weighed and mixed in the desired proportions and heated in a platinum alloy crucible in a furnace. The ingredients may be heated to a peak temperature (e.g., 800° C. to 1400° C., or 900° C. to 1050° C.) and held for a time such that the material forms a melt that is substantially liquid and homogeneous (e.g., 20 minutes to 2 hours). The melt optionally is stirred, either intermittently or continuously. In an embodiment, the melting process results in a material wherein the constituent chemical elements are fully mixed at an atomic level. The molten material is then typically quenched in any suitable way including, without limitation, passing it between counter-rotating stainless steel rollers to form 0.25 to 0.50 mm thick platelets, by pouring it onto a thick stainless steel plate, or by pouring it into water or other quench fluid. The resulting particles are then milled to form a powder or frit, which typically may have a $d_{50}$ of 0.2 to 3.0 μm.

Other production techniques may also be used for the present boron lithium tellurium oxide material. One skilled in the art of producing such materials might therefore employ alternative synthesis techniques including, but not limited to, melting in non-precious metal crucibles, melting in ceramic crucibles, sol-gel, spray pyrolysis, or others appropriate for making powder forms of glass.

A skilled person would recognize that the choice of raw materials could unintentionally include impurities that may be incorporated into the boron lithium tellurium oxide material during processing. For example, these incidental impurities may be present in the range of hundreds to thousands of parts per million. Impurities commonly occurring in industrial materials used herein are known to one of ordinary skill.

The presence of the impurities would not substantially alter the properties of the boron lithium tellurium oxide itself, paste compositions made with the boron lithium tellurium oxide, or a fired device manufactured using the paste composition. For example, a solar cell employing a conductive structure made using the present paste composition may have the efficiency described herein, even if the composition includes impurities.

The boron lithium tellurium oxide used in the present composition is believed to assist in the partial or complete penetration of the oxide and/or nitride insulating layer commonly present on a silicon semiconductor wafer during firing. As described herein, this at least partial penetration may facilitate the formation of an effective, mechanically robust electrical contact between a conductive structure manufactured using the present composition and the underlying silicon semiconductor of a photovoltaic device structure.

The boron lithium tellurium oxide material in the present paste composition may optionally comprise a plurality of separate fusible substances, such as one or more frits, or a substantially crystalline material with additional frit material. In an embodiment, a first fusible subcomponent is chosen for its capability to rapidly etch an insulating layer, such as that typically present on the front surface of a photovoltaic cell; further, the first fusible subcomponent may have strong etching power and low viscosity. A second fusible subcomponent is optionally included to slowly blend with the first fusible subcomponent to alter the chemical activity. Preferably, the composition is such that the insulating layer is partially removed but without attacking the underlying emitter diffused region, which would shunt the device, were the corrosive action to proceed unchecked. Such fusible materials may be characterized as having a viscosity sufficiently high to provide a stable manufacturing window to remove insulating layers without damage to the diffused p-n junction region of a semiconductor substrate. Ideally, the firing process results in a substantially complete removal of the insulating layer without further combination with the underlying Si substrate or the formation of substantial amounts of non-conducting or poorly conducting inclusions.

C. Optional Oxide Additive

As noted above, an optional oxide may be included in the present paste composition as a discrete additive, such as an oxide of one or more of Al, Na, K, Rb, Cs, Mg, Ca, Sr, Ba, Ti, V, Cr, Mn, Fe, Co, Ni, Cu, Zn, Zr, Nb, Si, Mo, Hf, W, Ag, Ga, Ge, In, Sn, Sb, Se, Ru, Bi, P, Y, La, or mixtures thereof, or a substance that forms such an oxide upon heating. The oxide additive can be incorporated in the paste composition in a powder form as received from the supplier, or the powder can be ground or milled to a smaller average particle size. Particles of any size can be employed, as long as they can be incorporated into the present paste composition and provide its required functionality. In an embodiment, the paste composition comprises up to 5 wt. % of the discrete oxide additive.

Any size-reduction method known to those skilled in the art can be employed to reduce particle size to a desired level. Such processes include, without limitation, ball milling, media milling, jet milling, vibratory milling, and the like, with or without a solvent present. If a solvent is used, water is the preferred solvent, but other solvents may be employed as well, such as alcohols, ketones, and aromatics. Surfactants may be added to the solvent to aid in the dispersion of the particles, if desired.

II. Organic Vehicle

The inorganic components of the present composition are typically mixed with an organic vehicle to form a relatively viscous material referred to as a "paste" or an "ink" that has a consistency and rheology that render it suitable for printing processes, including without limitation screen printing. The mixing is typically done with a mechanical system, and the constituents may be combined in any order, as long as they are uniformly dispersed and the final formulation has characteristics such that it can be successfully applied during end use.

A wide variety of inert materials can be admixed in an organic medium in the present composition including, without limitation, an inert, non-aqueous liquid that may or may not contain thickeners, binders, or stabilizers. By "inert" is meant a material that may be removed by a firing operation without leaving any substantial residue and that has no other effects detrimental to the paste or the final conductor line properties.

The proportions of organic vehicle and inorganic components in the present paste composition can vary in accordance with the method of applying the paste and the kind of organic vehicle used. In an embodiment, the present paste composition typically contains about 50 to 95 wt. %, 76 to 95 wt. %, or 85 to 95 wt. %, of the inorganic components and about 5 to 50 wt. %, 5 to 24 wt. %, or 5 to 15 wt. %, of the organic vehicle.

The organic vehicle typically provides a medium in which the inorganic components are dispersible with a good degree of stability. In particular, the composition preferably has a stability compatible not only with the requisite manufacturing, shipping, and storage, but also with conditions encountered during deposition, e.g., by a screen printing process. Ideally, the rheological properties of the vehicle are such that it lends good application properties to the composition, including stable and uniform dispersion of solids, appropriate viscosity and thixotropy for printing, appropriate wettability of the paste solids and the substrate on which printing will occur, a rapid drying rate after deposition, and stable firing properties.

Substances useful in the formulation of the organic vehicle of the present paste composition include, without limitation, ones disclosed in U.S. Pat. No. 7,494,607 and International Patent Application Publication No. WO 2010/123967 A2, both of which are incorporated herein in their entirety for all purposes, by reference thereto. The disclosed substances include ethylhydroxyethyl cellulose, wood rosin, mixtures of ethyl cellulose and phenolic resins, cellulose acetate, cellulose acetate butyrate, polymethacrylates of lower alcohols, monobutyl ether of ethylene glycol, monoacetate ester alcohols, and terpenes such as alpha- or beta-terpineol or mixtures thereof with other solvents such as kerosene, dibutylphthalate, butyl carbitol, butyl carbitol acetate, hexylene glycol, and high-boiling alcohols and alcohol esters.

Solvents useful in the organic vehicle include, without limitation, ester alcohols and terpenes such as alpha- or beta-terpineol or mixtures thereof with other solvents such as kerosene, dibutylphthalate, butyl carbitol, butyl carbitol acetate, hexylene glycol, and high-boiling alcohols and alcohol esters. A preferred ester alcohol is the monoisobutyrate of 2,2,4-trimethyl-1,3-pentanediol, which is available commercially from Eastman Chemical (Kingsport, Tenn.) as TEXANOL™. Some embodiments may also incorporate volatile liquids in the organic vehicle to promote rapid hardening after application on the substrate. Various combinations of these and other solvents are formulated to provide the desired viscosity and volatility.

In an embodiment, the organic vehicle may include one or more components selected from the group consisting of: bis(2-(2butoxyethoxy)ethyl) adipate, dibasic esters, octyl epoxy tallate, isotetradecanol, and a pentaerythritol ester of hydrogenated rosin. The paste compositions may also include additional additives or components.

The dibasic ester useful in the present paste composition may comprise one or more dimethyl esters selected from the group consisting of dimethyl ester of adipic acid, dimethyl ester of glutaric acid, and dimethyl ester of succinic acid. Various forms of such materials containing different proportions of the dimethyl esters are available under the DBE® trade name from Invista (Wilmington, Del.). For the present paste composition, a preferred version is sold as DBE-3 and is said by the manufacturer to contain 85 to 95 weight percent dimethyl adipate, 5 to 15 weight percent dimethyl glutarate, and 0 to 1.0 weight percent dimethyl succinate based on total weight of dibasic ester.

Further ingredients optionally may be incorporated in the organic vehicle, such as thickeners, stabilizers, and/or other common additives known to those skilled in the art. The organic vehicle may be a solution of one or more polymers in a solvent. Additionally, effective amounts of additives, such as surfactants or wetting agents, may be a part of the organic vehicle. Such added surfactant may be included in the organic vehicle in addition to any surfactant included as a coating on the conductive metal powder of the paste composition. Suitable wetting agents include phosphate esters and soya lecithin. Both inorganic and organic thixotropes may also be present.

Among the commonly used organic thixotropic agents are hydrogenated castor oil and derivatives thereof, but other suitable agents may be used instead of, or in addition to, these substances. It is, of course, not always necessary to incorporate a thixotropic agent since the solvent and resin properties coupled with the shear thinning inherent in any suspension may alone be suitable in this regard.

A polymer frequently used in printable conductive metal pastes is ethyl cellulose. Other exemplary polymers that may be used include ethylhydroxyethyl cellulose, wood rosin and derivatives thereof, mixtures of ethyl cellulose and phenolic resins, cellulose acetate, cellulose acetate butyrate, poly (methacrylate)s of lower alcohols, and monoalkyl ethers of ethylene glycol monoacetate.

Any of these polymers may be dissolved in a suitable solvent, including those described herein.

The polymer in the organic vehicle may be present in the range of 0.1 wt. % to 5 wt. % of the total composition. The present paste composition may be adjusted to a predetermined, screen-printable viscosity, e.g., with additional solvent(s).

III. Formation of Conductive Structures

An aspect of the invention provides a process that may be used to form a conductive structure on a substrate. The process generally comprises the steps of providing the substrate, applying a paste composition, and firing the substrate. Ordinarily, the substrate is planar and relatively thin, thus defining first and second major surfaces on its opposite sides.

Application

The present composition can be applied as a paste onto a preselected portion of a major surface of the substrate in a variety of different configurations or patterns. The preselected portion may comprise any fraction of the total first major surface area, including substantially all of the area. In an embodiment, the paste is applied on a semiconductor substrate, which may be single-crystal, cast mono, multi-crystal, polycrystalline, or ribbon silicon, or any other semiconductor material.

The application can be accomplished by a variety of deposition processes, including printing. Exemplary deposition processes include, without limitation, plating, extrusion or co-extrusion, dispensing from a syringe, and screen, inkjet, shaped, multiple, and ribbon printing. The paste composition ordinarily is applied over any insulating layer present on the first major surface of the substrate.

The conductive composition may be printed in any useful pattern. For example, the electrode pattern used for the front side of a photovoltaic cell commonly includes a plurality of narrow grid lines or fingers connected to one or more bus bars. In an embodiment, the width of the lines of the conductive fingers may be 20 to 200 µm; 25 to 100 µm; or 35 to 75 µm. In an embodiment, the thickness of the lines of the conductive fingers may be 5 to 50 µm; 10 to 35 µm; or 15 to 30 µm. Such a pattern permits the generated current to be extracted without undue resistive loss, while minimizing the area of the front side obscured by the metallization, which reduces the amount of incoming light energy that can be converted to electrical energy. Ideally, the features of the electrode pattern should be well defined, with a preselected thickness and shape, and have high electrical conductivity and low contact resistance with the underlying structure.

Conductors formed by printing and firing a paste such as that provided herein are often denominated as "thick-film"

conductors, since they are ordinarily substantially thicker than traces formed by atomistic processes, such as those used in fabricating integrated circuits. For example, thick-film conductors may have a thickness after firing of about 1 to 100 µm. Consequently, paste compositions that in their processed form provide conductivity and are suitably applied using printing processes are often called "thick-film pastes" or "conductive inks."

Firing

A firing operation may be used in the present process to effect a substantially complete burnout of the organic vehicle from the deposited paste. The firing typically involves volatilization and/or pyrolysis of the organic materials. A drying operation optionally precedes the firing operation, and is carried out at a modest temperature to harden the paste composition by removing its most volatile organics.

The firing process is believed to remove the organic vehicle, sinter the conductive metal in the composition, and establish electrical contact between the semiconductor substrate and the fired conductive metal. Firing may be performed in an atmosphere composed of air, nitrogen, an inert gas, or an oxygen-containing mixture such as a mixed gas of oxygen and nitrogen.

In one embodiment, the temperature for the firing may be in the range between about 300° C. to about 1000° C., or about 300° C. to about 525° C., or about 300° C. to about 650° C., or about 650° C. to about 1000° C. The firing may be conducted using any suitable heat source. In an embodiment, the firing is accomplished by passing the substrate bearing the printed paste composition pattern through a belt furnace at high transport rates, for example between about 100 to about 500 cm per minute, with resulting hold-up times between about 0.05 to about 5 minutes. Multiple temperature zones may be used to control the desired thermal profile, and the number of zones may vary, for example, between 3 to 11 zones. The temperature of a firing operation conducted using a belt furnace is conventionally specified by the furnace set point in the hottest zone of the furnace, but it is known that the peak temperature attained by the passing substrate in such a process is somewhat lower than the highest set point. Other batch and continuous rapid fire furnace designs known to one of skill in the art are also contemplated.

In a further embodiment, other conductive and device enhancing materials are applied prior to firing to the opposite type region of the semiconductor device. The various materials may be applied and then co-fired, or they may be applied and fired sequentially.

In an embodiment, the opposite type region may be on the non-illuminated (back) side of the device, i.e., its second major surface. The materials serve as electrical contacts, passivating layers, and solderable tabbing areas. In an aspect of this embodiment, the back-side conductive material may contain aluminum. Exemplary back-side aluminum-containing compositions and methods of application are described, for example, in US 2006/0272700, which is hereby incorporated herein in its entirety for all purposes by reference thereto. Suitable solderable tabbing materials include those containing silver, silver and aluminum, and other mixtures of silver and base metals. Exemplary tabbing compositions containing aluminum and silver are described, for example in US 2006/0231803, which is hereby incorporated herein in its entirety for all purposes by reference thereto.

In a further embodiment, the present paste composition may be employed in the construction of semiconductor devices wherein the p and n regions are formed side-by-side in a substrate, instead of being respectively adjacent to opposite major surfaces of the substrate. In an implementation in this configuration, the electrode-forming materials may be applied in different portions of a single side of the substrate, e.g., on the non-illuminated (back) side of the device, thereby maximizing the amount of light incident on the illuminated (front) side.

Insulating Layer

In some embodiments of the invention, the paste composition is used in conjunction with a substrate, such as a semiconductor substrate, having an insulating layer present on one or more of the substrate's major surfaces. The layer may comprise one or more components selected from aluminum oxide, titanium oxide, silicon nitride, $SiN_x$:H (silicon nitride containing hydrogen for passivation during subsequent firing processing), silicon oxide, and silicon oxide/titanium oxide, and may be in the form of a single, homogeneous layer or multiple sequential sub-layers of any of these materials. Silicon nitride and $SiN_x$:H are widely used.

The insulating layer provides some embodiments of the cell with an anti-reflective property, which lowers the cell's surface reflectance of light incident thereon, thereby improving the cell's utilization of the incident light and increasing the electrical current it can generate. Thus, the insulating layer is often denoted as an anti-reflective coating (ARC). The thickness of the layer preferably is chosen to maximize the anti-reflective property in accordance with the layer material's composition and refractive index. In one approach, the deposition processing conditions are adjusted to vary the stoichiometry of the layer, thereby altering properties such as the refractive index to a desired value. For a silicon nitride layer with a refractive index of about 1.9 to 2.0, a thickness of about 700 to 900 Å (70 to 90 nm) is suitable.

The insulating layer may be deposited on the substrate by methods known in the microelectronics art, such as any form of chemical vapor deposition (CVD) including plasma-enhanced CVD (PECVD) and thermal CVD, thermal oxidation, or sputtering. In another embodiment, the substrate is coated with a liquid material that under thermal treatment decomposes or reacts with the substrate to form the insulating layer. In still another embodiment, the substrate is thermally treated in the presence of an oxygen- or nitrogen-containing atmosphere to form an insulating layer. Alternatively, no insulating layer is specifically applied to the substrate, but a naturally forming substance, such as silicon oxide on a silicon wafer, may function as an insulating layer.

The present method optionally includes the step of forming the insulating layer on the semiconductor substrate prior to the application of the paste composition.

In some implementations of the present process, the paste composition is applied over any insulating layer present on the substrate, whether specifically applied or naturally occurring. The paste's fusible material and any additive present may act in concert to combine with, dissolve, or otherwise penetrate some or all of the thickness of any insulating layer material during firing. Preferably, good electrical contact between the paste composition and the underlying semiconductor substrate is thereby established. Ideally, the firing results in a secure attachment of the conductive metal structure to the substrate, with a metallurgical bond being formed over substantially all the area of the substrate covered by the conductive element. In an embodiment, the conductive metal is separated from the silicon by a nanometer-scale interfacial film layer (typically of order 5 nm or less) through which the photoelectrons tunnel. In another embodiment, contact is made between the conductive metal and the silicon by a combination of direct metal-to-silicon contact and tunneling through thin interfacial film layers.

Firing also promotes the formation of both good electrical conductivity in the conductive element itself and a low-resistance connection to the substrate, e.g., by sintering the conductive metal particles and etching through the insulating layer. While some embodiments may function with electrical contact that is limited to conductive domains dispersed over the printed area, it is preferred that the contact be uniform over substantially the entire printed area.

Structures

An embodiment of the present invention relates to a structure comprising a substrate and a conductive electrode, which may be formed by the process described above.

Semiconductor Device Manufacture

The structures described herein may be useful in the manufacture of semiconductor devices, including photovoltaic devices. An embodiment of the invention relates to a semiconductor device containing one or more structures described herein. Another embodiment relates to a photovoltaic device containing one or more structures described herein. Still further, there is provided a photovoltaic cell containing one or more structures described herein and a solar panel containing one or more of these structures.

In various embodiments, the present paste composition is useful in constructing photovoltaic devices on silicon wafers having a variety of doping profiles. For example, these devices are frequently constructed on ~200 μm p-type wafers having a ~0.4 μm layer of n-type Si on the wafer's front surface to serve as the emitter, Cells can be constructed using the present paste composition on wafers with a range of concentrations and profiles of the dopant, including cells commonly regarded as having a highly or heavily doped emitter (HDE) wherein the P dopant at the surface [$P_{surface}$] ranges from 9 to $15 \times 10^{20}$ atoms/cm$^3$. The active [$P_{surface}$] in these wafers typically ranges from 3 to $4 \times 10^{20}$ atoms/cm$^3$. The paste composition is also useful with lightly or low doped emitters (LDE) having [$P_{surface}$]<$1 \times 10^{20}$ atoms/cm$^3$.

In another aspect, the present invention relates to a device, such as an electrical, electronic, semiconductor, photodiode, or photovoltaic device. Various embodiments of the device include a junction-bearing semiconductor substrate and an insulating layer, such as a silicon nitride layer, present on a first major surface of the substrate.

One possible sequence of steps implementing the present process for manufacture of a photovoltaic cell device is depicted by FIGS. 1A-1F.

FIG. 1A shows a p-type substrate 10, which may be single-crystal, multi-crystalline, or polycrystalline silicon. For example, substrate 10 may be obtained by slicing a thin layer from an ingot that has been formed from a pulling or casting process. Surface damage and contamination (from slicing with a wire saw, for example) may be removed by etching away about 10 to 20 μm of the substrate surface using an aqueous alkali solution such as aqueous potassium hydroxide or aqueous sodium hydroxide, or using a mixture of hydrofluoric acid and nitric acid. In addition, the substrate may be washed with a mixture of hydrochloric acid and optional hydrogen peroxide to remove heavy metals such as iron adhering to the substrate surface. Substrate 10 may have a first major surface 12 that is textured to reduce light reflection. Texturing may be produced by etching a major surface with an aqueous alkali solution such as aqueous potassium hydroxide or aqueous sodium hydroxide. Substrate 10 may also be formed from a silicon ribbon.

Figure 1B:
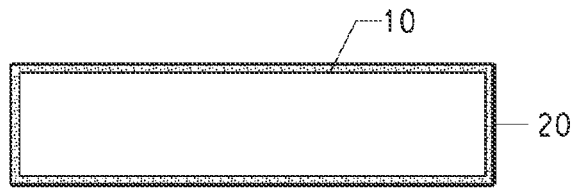

In FIG. 1B, an n-type diffusion layer 20 is formed to create a p-n junction with p-type material below. The n-type diffusion layer 20 can be formed by any suitable doping process, such as thermal diffusion of phosphorus (P) provided from phosphorus oxychloride (POCl$_3$) or ion implantation. In the absence of any particular modifications, the n-type diffusion layer 20 is formed over the entire surface of the silicon p-type substrate. The depth of the diffusion layer can be varied by controlling the diffusion temperature and time, and is generally formed in a thickness range of about 0.3 to 0.5 μm. The n-type diffusion layer may have a sheet resistivity from several tens of ohms per square up to about 120 ohms per square.

Figure 1C:
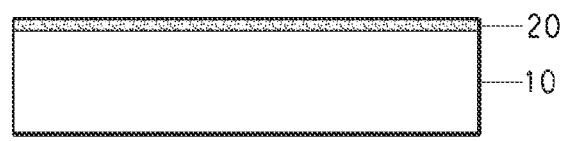

After protecting one surface of the n-type diffusion layer 20 with a resist or the like, the n-type diffusion layer 20 is removed from most surfaces by etching so that it remains only on the first major surface 12 of substrate 10, as shown in FIG. 1C. The resist is then removed using an organic solvent or the like.

Figure 1D:
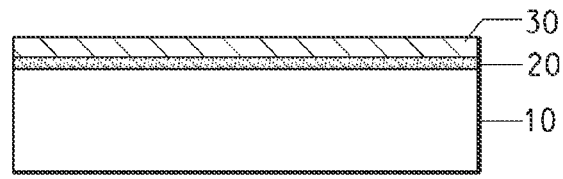

Next, as shown in FIG. 1D, an insulating layer 30, which also functions as an anti-reflective coating, is formed on the n-type diffusion layer 20. The insulating layer is commonly silicon nitride, but can also be a layer of another material, such as SiN$_x$:H (i.e., the insulating layer comprises hydrogen for passivation during subsequent firing processing), titanium oxide, silicon oxide, mixed silicon oxide/titanium oxide, or aluminum oxide. The insulating layer can be in the form of a single layer or multiple layers of the same or different materials.

Figure 1E:
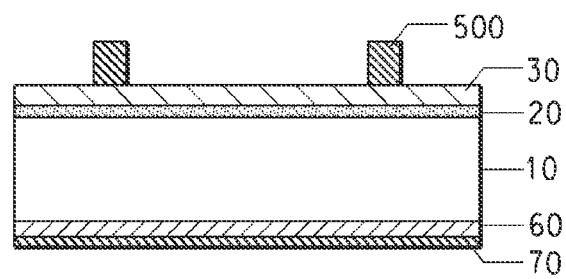

Next, electrodes are formed on both major surfaces 12 and 14 of the substrate. As shown in FIG. 1E, a paste composition 500 of this invention is screen printed on the insulating layer 30 of the first major surface 12 and then dried. For a photovoltaic cell, paste composition 500 is typically applied in a predetermined pattern of conductive lines extending from one or more bus bars that occupy a predetermined portion of the surface. In addition, aluminum paste 60 and back-side silver paste 70 are screen printed onto the back side (the second major surface 14 of the substrate) and successively dried. The screen printing operations may be carried out in any order. For the sake of production efficiency, all these pastes are typically processed by co-firing them at a temperature in the range of about 700° C. to about 975° C. for a period of from several seconds to several tens of minutes in air or an oxygen-containing atmosphere. An infrared-heated belt furnace is conveniently used for high throughput.

Figure 1F:
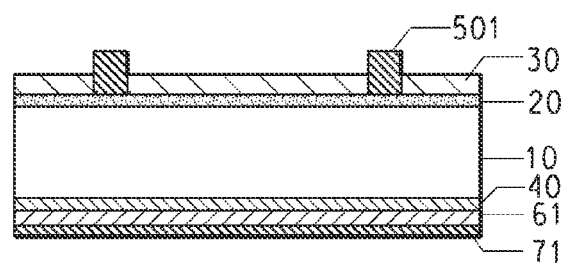

As shown in FIG. 1F, the firing causes the depicted paste composition 500 on the front side to sinter and penetrate through the insulating layer 30, thereby achieving electrical contact with the n-type diffusion layer 20, a condition known as "fire through." This fired-through state, i.e., the extent to which the paste reacts with and passes through the insulating layer 30, depends on the quality and thickness of the insulating layer 30, the composition of the paste, and on the firing conditions. A high-quality fired-through state is believed to be an important factor in obtaining high conversion efficiency in a photovoltaic cell. Firing thus converts paste 500 into electrode 501, as shown in FIG. 1F.

The firing further causes aluminum to diffuse from the back-side aluminum paste into the silicon substrate, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. During firing, the boundary between the back-side aluminum and the back-side silver assumes the state of an alloy, thereby achieving electrical connection. Most areas of the back electrode are occupied by the aluminum electrode, owing in part to the need to form a p+ layer 40. Since there is no need for incoming light to penetrate the back side, substantially the entire surface may be covered. At the same time, because soldering to an aluminum electrode is unfeasible, a silver or silver/aluminum back electrode is formed on limited areas of the back side as an electrode to permit soldered attachment of interconnecting copper ribbons or the like.

While the present invention is not limited by any particular theory of operation, it is believed that, upon firing, the boron lithium tellurium oxide material, with any additive component present acting in concert, promotes rapid etching of the insulating layer conventionally used on the front side of a photovoltaic cell. Efficient etching in turn permits the formation of a low resistance, front-side electrical contact between the metal(s) of the composition and the underlying substrate.

It will be understood that the present paste composition and process may also be used to form electrodes, including a front-side electrode, of a photovoltaic cell in which the p- and n-type layers are reversed from the construction shown in FIGS. 1A-1F, so that the substrate is n-type and a p-type material is formed on the front side.

In yet another embodiment, this invention provides a semiconductor device that comprises a semiconductor substrate having a first major surface; an insulating layer optionally present on the first major surface of the substrate; and, disposed on the first major surface, a conductive electrode pattern having a preselected configuration and formed by firing a paste composition as described above.

A semiconductor device fabricated as described above may be incorporated into a photovoltaic cell. In another embodiment, this invention thus provides a photovoltaic cell array that includes a plurality of the semiconductor devices as described, and made as described, herein.

EXAMPLES

The operation and effects of certain embodiments of the present invention may be more fully appreciated from a series of examples (Examples 1-4, represented by Samples 1-29) described below. The embodiments on which these examples are based are representative only, and the selection of those embodiments to illustrate aspects of the invention does not indicate that materials, components, reactants, conditions, techniques and/or configurations not described in the examples are not suitable for use herein, or that subject matter not described in the examples is excluded from the scope of the appended claims and equivalents thereof.

Example 1

Paste Preparation

In accordance with the present disclosure, a series of boron lithium tellurium oxide materials was prepared. The compositions set forth in Table I were formulated by combining requisite amounts of the oxides or carbonates of B, Te, Li, Na, Cr, Ca, and Zn. The amount of each oxide or carbonate was selected to provide in the combined boron lithium tellurium oxide the cation percentages listed in Table I.

The various ingredients for each composition were intimately mixed by melting them in a covered Pt crucible that was heated in air from room temperature to 1000° C. over a period of 1 hour, and held at the respective temperature for 30 minutes. Each melt was separately poured onto the flat surface of a cylindrically-shaped stainless steel block (8 cm high, 10 cm in diameter). The cooled buttons were pulverized to a −100 mesh coarse powder.

Then the coarse powder was ball milled in a polyethylene container with zirconia media and a suitable liquid, such as water, isopropyl alcohol, or water containing 0.5 wt. % TRITON™ X-100 octylphenol ethoxylate surfactant (available from Dow Chemical Company, Midland, Mich.) until the $d_{50}$ was in the range of 0.5 to 2 µm.

TABLE I

Boron Lithium Tellurium Oxide Material Compositions

| Sample # | cation % B | cation % Li | cation % Te | cation % Na | cation % Ca | cation % Cr | cation % Zn |
|---|---|---|---|---|---|---|---|
| 1 | 35.01 | 19.99 | 45.00 | | | | |
| 2 | 35.01 | 19.99 | 45.00 | | | | |
| 3 | 35.01 | 19.99 | 45.00 | | | | |
| 4 | 34.99 | 12.00 | 44.96 | 4.00 | 4.06 | | |
| 5 | 20.00 | 30.00 | 50.00 | | | | |
| 6 | 20.00 | 15.01 | 64.99 | | | | |
| 7 | 30.00 | 15.00 | 55.00 | | | | |
| 8 | 30.00 | 22.50 | 47.50 | | | | |
| 9 | 20.00 | 22.50 | 57.50 | | | | |
| 10 | 20.00 | 22.50 | 57.50 | | | | |
| 11 | 40.00 | 22.51 | 37.50 | | | | |
| 12 | 40.00 | 22.50 | 37.50 | | | | |
| 13 | 40.09 | 14.99 | 44.92 | | | | |
| 14 | 30.02 | 29.99 | 39.99 | | | | |
| 15 | 40.00 | 30.01 | 29.99 | | | | |
| 16 | 30.02 | 29.99 | 39.99 | | | | |
| 17 | 30.00 | 26.25 | 43.75 | | | | |
| 18 | 35.00 | 26.25 | 38.74 | | | | |
| 19 | 29.40 | 29.40 | 39.20 | | | | 2.00 |
| 20 | 28.80 | 28.80 | 38.40 | | | | 4.00 |
| 21 | 27.59 | 27.61 | 36.80 | | | | 8.00 |
| 22 | 30.00 | 24.00 | 44.00 | | 2.00 | | |
| 23 | 30.00 | 22.00 | 44.00 | | 4.00 | | |
| 24 | 30.00 | 18.00 | 44.00 | | 8.00 | | |

In accordance with an aspect of the invention, the boron lithium tellurium oxide materials of Samples 1 to 24 were formulated in paste compositions suitable for screen printing. The pastes, before adjusting their viscosities with additional solvent, consisted of approximately 9.7 wt. % vehicle and 1.5 or 2 wt. % boron lithium tellurium oxide material, with the remainder being silver powder.

The organic vehicle was prepared as a master batch using a planetary, centrifugal Thinky mixer (available from Thinky USA, Inc., Laguna Hills, Calif.) to mix the ingredients listed in Table II below, with percentages given by weight.

TABLE II

Organic Vehicle Composition

| Ingredient | wt. % |
|---|---|
| 11% ethyl cellulose (50-52% ethoxyl) dissolved in TEXANOL™ solvent | 13.98% |
| 8% ethyl cellulose (48-50% ethoxyl) dissolved in TEXANOL™ solvent | 5.38% |
| tallowpropylenediamine dioleate | 10.75% |
| pentaerythritol ester of hydrogenated rosin | 26.88% |

TABLE II-continued

Organic Vehicle Composition

| Ingredient | wt. % |
|---|---|
| Hydrogenated castor oil derivative | 5.38% |
| Dibasic ester | 37.63% |

For each paste, a suitable small portion of TEXANOL™ was added after three-roll milling to adjust the final viscosity to a level permitting the composition to be screen printed onto a substrate. Typically, a viscosity of about 300 Pa-s was found to yield good screen printing results, but some variation, for example ±50 Pa-s or more, would be acceptable, depending on the precise printing parameters.

Silver powder, represented by the manufacturer as having a predominantly spherical shape, and having a particle size distribution with a $d_{50}$ of about 2.3 μm (as measured in an isopropyl alcohol dispersion using a Horiba LA-910 analyzer), was combined with the milled frit in a glass jar and tumble mixed for 15 minutes. The inorganic mixture was then added by thirds to a Thinky jar containing the organic ingredients and Thinky-mixed for 1 minute at 2000 RPM after each addition, whereby the ingredients were well dispersed in the organic vehicle. After the final addition, the paste was cooled and the viscosity was adjusted to between about 300 and 400 Pa-s by adding solvent and Thinky mixing for 1 minute at 2000 RPM. The paste was then milled on a three-roll mill (Charles Ross and Son, Hauppauge, N.Y.) with a 25 μm gap for 3 passes at zero pressure and 3 passes at 100 psi (689 kPa).

Each paste composition was allowed to sit for at least 16 hours after roll milling, and then its viscosity was adjusted to ~300 Pa-s with additional solvent to render it suitable for screen printing. The viscometer was a Brookfield viscometer (Brookfield Inc., Middleboro, Mass.) with a #14 spindle and a #6 cup. Viscosity values were taken after 3 minutes at 10 RPM.

Example 2

Fabrication and Testing of Photovoltaic Cells

Cell Fabrication

Photovoltaic cells were fabricated in accordance with an aspect of the invention using most of the paste compositions of Example 1 to form the front-side electrodes of the cells. The compositions used and the amount of frit (in wt. % based on the total paste composition) in each is listed in Table III below.

Conventional Gintech mono-crystalline HDE wafers (available from Gintech Energy Corporation, Jhunan Township, Taiwan) having a thickness of ~200 μm and a sheet resistivity of ~65 ohms per square were used for fabrication and electrical testing. For convenience, the experiments were carried out using 28 mm×28 mm "cut down" wafers prepared by dicing 156 mm×156 mm starting wafers using a diamond wafering saw. The test wafers were screen printed using an AMI-Presco (AMI, North Branch, N.J.) MSP-485 screen printer, first to form a full ground plane back-side conductor using a conventional Al-containing paste, SOLAMET® PV381 (available from DuPont, Wilmington, Del.), and thereafter to form a bus bar and eleven conductor lines at a 0.254 cm pitch on the front surface using the various exemplary paste compositions herein. After printing and drying, cells were fired in a BTU rapid thermal processing, multi-zone belt furnace (BTU International, North Billerica, Mass.). Twenty five cells were printed using each paste; 5 cells were fired at each set point temperature in a 5-temperature ladder ranging from 880 to 940° C. After firing, the median conductor line width was about 110 μm and the mean line height was about 15 μm. The bus bar was about 1.25 mm wide. The median line resistivity was about 3.0 μΩ-cm. Performance of "cut-down" 28 mm×28 mm cells is known to be impacted by edge effects which reduce the overall photovoltaic cell efficiency by ~5% from what would be obtained with full-size wafers.

Electrical Testing

Electrical properties of photovoltaic cells as thus fabricated using the paste compositions of Samples 1 to 22 were measured at 25±1.0° C. using an ST-1000 IV tester (Telecom STV Co., Moscow, Russia). The Xe arc lamp in the IV tester simulated sunlight with a known intensity and irradiated the front surface of the cell. The tester used a four contact method to measure current (I) and voltage (V) at approximately 400 load resistance settings to determine the cell's I-V curve. Efficiency, fill factor (FF), and series resistance ($R_a$) were obtained from the I-V curve for each cell. $R_a$ is defined in a conventional manner as the negative of the reciprocal of the local slope of the IV curve near the open circuit voltage. As recognized by a person of ordinary skill, $R_a$ is conveniently determined and a close approximation for $R_s$, the true series resistance of the cell. For each composition, an optimum firing temperature was identified as the temperature that resulted in the highest median efficiency, based on the 5-cell test group for each composition and temperature. Electrical results for the cell groups fired at the respective optimal firing temperature are depicted in Table III below. Of course, this testing protocol is exemplary, and other equipment and procedures for testing efficiencies will be recognized by one of ordinary skill in the art.

TABLE III

Electrical Properties of Mono-crystalline Photovoltaic Cells

| Sample # | wt. % frit in paste | Eff. (%) | FF (%) | Ra (ohms) |
|---|---|---|---|---|
| 1 | 2.00 | 16.99 | 75.9 | 0.1748 |
| 2 | 1.50 | 17.08 | 76.6 | 0.1771 |
| 3 | 1.50 | 17.34 | 77.5 | 0.1604 |
| 4 | 1.50 | 9.52 | 43.6 | 0.9829 |
| 5 | 1.50 | 17.23 | 77.4 | 0.1546 |
| 6 | 1.50 | 16.21 | 71.6 | 0.2051 |
| 7 | 1.50 | 15.79 | 70.3 | 0.2889 |
| 8 | 1.50 | 17.05 | 75.8 | 0.1634 |
| 9 | 1.50 | 16.55 | 74.3 | 0.1687 |
| 10 | 1.50 | 16.93 | 76.2 | 0.1622 |
| 11 | 1.50 | 16.73 | 74.9 | 0.1776 |
| 12 | 1.50 | 16.95 | 76.9 | 0.1640 |
| 13 | 1.50 | 12.17 | 54.9 | 0.5627 |
| 14 | 1.50 | 17.18 | 77.9 | 0.1522 |
| 15 | 1.50 | 17.14 | 77.0 | 0.1561 |
| 16 | 1.50 | 17.29 | 77.8 | 0.1490 |
| 19 | 1.50 | 17.25 | 78.1 | 0.1511 |
| 20 | 1.50 | 17.22 | 77.7 | 0.1488 |
| 21 | 1.50 | 17.24 | 78.0 | 0.1479 |
| 22 | 1.50 | 16.46 | 74.4 | 0.1777 |

Example 3

Paste Preparation

In accordance with the present disclosure, another series of boron lithium tellurium oxide paste compositions was prepared, as set forth in Table IV. The same experimental procedures used to prepare the paste compositions of Example 1 were again used.

TABLE IV

Boron Lithium Tellurium Oxide Material Compositions

| Sample # | cation % B | cation % Li | cation % Te | cation % Ti | cation % Zn |
|---|---|---|---|---|---|
| 25 | 22 | 43 | 22 | 6.5 | 6.5 |
| 26 | 32.25 | 10.75 | 44 | 6.5 | 6.5 |
| 27 | 26.62 | 21.5 | 38.88 | 6.5 | 6.5 |
| 28 | 30.99 | 10.75 | 45.26 | 6.5 | 6.5 |
| 29 | 21.5 | 21.5 | 44 | 6.5 | 6.5 |

Example 4

Fabrication and Testing of Photovoltaic Cells

Photovoltaic cells were fabricated with front-side electrodes made using the paste compositions (Samples 25-29) of Example 3, as set forth in Table IV. The same preparation and characterization techniques used for the cells of Example 2 were again applied. Experiments were again carried out using 28 mm×28 mm "cut down" wafers. Results of the electrical testing of Examples 25-29 are shown in Table V.

TABLE V

Electrical Properties of Multi-crystalline Photovoltaic Cells

| Sample # | wt. % frit in paste | Eff. (%) | FF (%) | Ra (ohms) |
|---|---|---|---|---|
| 25 | 2 | 15.58 | 72.1 | 0.1758 |
| 26 | 2 | 17.05 | 76.2 | 0.1640 |
| 27 | 2 | 16.54 | 74.9 | 0.1782 |
| 28 | 2 | 16.77 | 74.4 | 0.2056 |
| 29 | 2 | 16.72 | 74.6 | 0.1861 |

The results set forth in Table III and V demonstrate that the present paste composition is useful in fabricating solar cells.

Having thus described the invention in rather full detail, it will be understood that this detail need not be strictly adhered to but that further changes and modifications may suggest themselves to one skilled in the art, all falling within the scope of the invention as defined by the subjoined claims.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In this specification, unless explicitly stated otherwise or indicated to the contrary by the context of usage, (a) amounts, sizes, ranges, formulations, parameters, and other quantities and characteristics recited herein, particularly when modified by the term "about", may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value; and (b) all numerical quantities of parts, percentage, or ratio are given as parts, percentage, or ratio by weight; the stated parts, percentage, or ratio by weight may or may not add up to 100.

What is claimed is:

1. A paste composition comprising:
   an inorganic solids portion comprising:
   a source of electrically conductive metal and
   a boron lithium tellurium oxide containing boron, lithium and tellurium cations that together comprise at least 80% of the cations present in the boron lithium tellurium oxide, and wherein the minimum content of boron, lithium and tellurium cations is at least 15, 10 and 20 cation%, respectively; and
   an organic vehicle in which the source of electrically conductive metal and the boron lithium tellurium oxide are dispersed.

2. The paste composition of claim 1, wherein the boron lithium tellurium oxide comprises 15 to 40 cation % B, 10 to 45 cation % Li, and 20 to 65 cation % Te.

3. The paste composition of claim 1, wherein the boron, lithium, and tellurium cations together comprise 80 to 100 cation % of the boron lithium tellurium oxide.

4. The paste composition of claim 3, wherein the boron lithium tellurium oxide comprises:
- 15 to 40 cation % of B;
- 10 to 45 cation % of Li;
- 20 to 65 cation % of Te;
- 0 to 20 cation % of Ca;
- 0 to 20 cation % of Sr;
- 0 to 20 cation % of Ba;
- 0 to 15 cation % of Mg;
- 0 to 15 cation % of Na;
- 0 to 17 cation % of Si;
- 0 to 10 cation % of Cr;
- 0 to 12 cation % of Zn; and
- 0 to 10 cation % of Ti, plus incidental impurities.

5. The paste composition of claim 1, wherein the boron lithium tellurium oxide further comprises up to 15 cation % of at least one oxide selected from the group consisting of oxides of one or more of Al, Na, K, Rb, Cs, Ti, V, Cr, Mn, Fe, Co, Ni, Cu, Zn, Zr, Nb, Si, Mo, Hf, W, Ag, Ga, Ge, In, Sn, Sb, Se, Ru, Bi, P, Y, La and the other lanthanide elements, and mixtures thereof.

6. The paste composition of claim 5, wherein the boron lithium tellurium oxide comprises up to 15 cation % of at least one oxide selected from the group consisting of oxides of Ti, Cr, Zn, Fe, Mn, Na, and K.

7. The paste composition of claim 1, wherein the boron lithium tellurium oxide further comprises up to 4.5 cation % of one or more of the alkaline earth metals Mg, Ca, Sr, and Ba.

8. The paste composition of claim 7, wherein the boron lithium tellurium oxide comprises 20 to 29.5 cation % Te.

9. The paste composition of claim 1, wherein the boron lithium tellurium oxide comprises 20 to 24.5 cation % Te.

10. The paste composition of claim 1, wherein the boron lithium tellurium oxide further comprises up to 5 cation % of Pb.

11. The paste composition of claim 1, wherein up to 10 anion percent of the oxygen anions of the boron lithium tellurium oxide are replaced by halogen anions.

12. The paste composition of claim 1, comprising 1 to 10 weight % of the boron lithium tellurium oxide.

13. The paste composition of claim 1, wherein the source of the electrically conductive metal is an electrically conductive metal powder.

14. The paste composition of claim 1, wherein the electrically conductive metal comprises Ag.

15. The paste composition of claim 14, wherein the Ag comprises 75 to 99 wt. % of the inorganic solids portion in the composition.

16. The paste composition of claim 1, wherein the paste composition is lead-free.

17. The paste composition of claim 1, further comprising at least one discrete oxide additive selected from the group consisting of an oxide of Al, Li, Na, K, Rb, Cs, Mg, Ca, Sr, Ba, Ti, V, Cr, Mn, Fe, Co, Ni, Cu, Zn, Zr, Nb, Si, Mo, Hf, W, Ag, Ga, Ge, In, Sn, Sb, Se, Ru, Bi, P, Y, La and the other lanthanide elements, and mixtures thereof, and a substance which forms such an oxide upon firing.

18. A process for forming an electrically conductive structure on a substrate, the process comprising:
(a) providing a substrate having a first major surface and an insulating layer thereon that comprises aluminum oxide, titanium oxide, silicon nitride, $SiN_x$:H, silicon oxide, or silicon oxide/titanium oxide;
(b) applying a paste composition onto a preselected portion of the insulating layer on the first major surface, wherein the paste composition comprises:
  i) a source of electrically conductive metal,
  ii) a boron lithium tellurium oxide containing boron, lithium and tellurium cations that together comprise at least 80% of the cations present in the boron lithium tellurium oxide, and wherein the minimum content of boron, lithium and tellurium cations is at least 15, 10 and 20 cation%, respectively; and
  iii) an organic vehicle in which the source of electrically conductive metal and the boron lithium tellurium oxide are dispersed; and
(c) firing the substrate and paste composition thereon, wherein the insulating layer is penetrated and the electrically conductive metal is sintered during the firing to form the electrically conductive structure and provide electrical contact between the electrically conductive metal and the substrate.

19. An article comprising a substrate and an electrically conductive structure thereon, the article having been formed by the process of claim 18.

20. The article of claim 19, wherein the article comprises a photovoltaic cell.

* * * * *